(12) United States Patent
Wu et al.

(10) Patent No.: US 8,288,330 B2
(45) Date of Patent: Oct. 16, 2012

(54) COMPOSITION AND METHOD FOR PHOTORESIST REMOVAL

(75) Inventors: Aiping Wu, Macungie, PA (US); John Anthony Marsella, Allentown, PA (US)

(73) Assignee: Air Products and Chemicals, Inc., Allentown, PA (US)

(*) Notice: Subject to any disclaimer, the term of this patent is extended or adjusted under 35 U.S.C. 154(b) by 1051 days.

(21) Appl. No.: 11/738,699

(22) Filed: Apr. 23, 2007

(65) Prior Publication Data

US 2007/0272275 A1    Nov. 29, 2007

Related U.S. Application Data

(60) Provisional application No. 60/809,085, filed on May 26, 2006.

(51) Int. Cl.
    *C11D 7/50*    (2006.01)
(52) U.S. Cl. .......... 510/175; 510/176; 510/407; 134/1.3
(58) Field of Classification Search .................. 510/175, 510/176, 407; 134/1.3
    See application file for complete search history.

(56) References Cited

U.S. PATENT DOCUMENTS

| | | | |
|---|---|---|---|
| 4,304,681 A | 12/1981 | Martin et al. | |
| 4,401,748 A | 8/1983 | Ward et al. | |
| 5,049,314 A * | 9/1991 | Short | 510/212 |
| 5,139,607 A | 8/1992 | Ward et al. | |
| 5,622,921 A * | 4/1997 | Dyer | 507/259 |
| 5,759,975 A * | 6/1998 | Maxwell | 510/203 |
| 6,261,735 B1 | 7/2001 | Sahbari | |
| 6,423,677 B1 * | 7/2002 | Van Eenam | 510/365 |
| 6,475,292 B1 | 11/2002 | Sahbari | |
| 6,683,034 B1 | 1/2004 | Oh et al. | |
| 6,916,772 B2 * | 7/2005 | Zhou et al. | 510/201 |
| 7,049,472 B2 | 5/2006 | Lal et al. | |
| 2002/0058600 A1 * | 5/2002 | Van Eenam | 510/408 |
| 2003/0130148 A1 | 7/2003 | Lee et al. | |
| 2004/0112759 A1 | 6/2004 | Zazzera et al. | |
| 2004/0127374 A1 | 7/2004 | Jo et al. | |
| 2004/0147421 A1 * | 7/2004 | Charm et al. | 510/176 |
| 2005/0137103 A1 | 6/2005 | Moore | |
| 2005/0143270 A1 | 6/2005 | Wojtczak et al. | |
| 2005/0217697 A1 | 10/2005 | Egbe et al. | |
| 2005/0250660 A1 | 11/2005 | Takashima | |
| 2006/0016785 A1 * | 1/2006 | Egbe et al. | 216/83 |
| 2006/0035797 A1 | 2/2006 | Tomita et al. | |
| 2006/0043070 A1 | 3/2006 | Moore | |
| 2006/0046944 A1 * | 3/2006 | Hata et al. | 510/175 |
| 2006/0079431 A1 | 4/2006 | Lal et al. | |
| 2008/0210900 A1 * | 9/2008 | Wojtczak et al. | 252/79.3 |

FOREIGN PATENT DOCUMENTS

| EP | 1 619 557 A1 | 1/2006 |
|---|---|---|
| WO | 2004/027518 A2 | 4/2004 |

* cited by examiner

*Primary Examiner* — Gregory Webb
(74) *Attorney, Agent, or Firm* — Geoffrey L. Chase; Anne B. Kiernan

(57) ABSTRACT

The present invention is a composition for removal of multi-layer photoresist layers on an electronic device substrate for rework of the photoresist on the substrate, comprising; (i) a solvent blend of at least three discrete solvents, (ii) at least one organic sulfonic acid, and (iii) at least one corrosion inhibitor. The present invention is also a method for using the composition. This composition and method succeed in removing such multi-layer photoresist at temperatures less than 65° C. and in contact times under three minutes, allowing high throughput on single wafer tools.

14 Claims, 2 Drawing Sheets

COMPOSITION AND METHOD FOR PHOTORESIST REMOVAL

CROSS REFERENCE TO RELATED PATENT APPLICATIONS

This application claims the benefit of U.S. Provisional Patent Application Ser. No. 60/809,085 filed 26 May 2006.

BACKGROUND OF THE INVENTION

The problem confronted by the electronic fabrication industry is to dissolve bi-layer photoresist for rework processes, which need to be done at less than 65° C./3 minutes using single wafer tool process. For the conventional photoresist strippers, the problem can be resolved at high operation temperatures (>75° C.) and long process times (over 10 minutes). For some conventional strippers, photoresist is removed by lifting-off rather than dissolving. Non-dissolved or partially dissolved photoresist can clog the filter in the recirculation tool or re-deposit on the wafer, either of which is not acceptable by current semiconductor customers.

Therefore, the conventional photoresist strippers are not suitable candidates for this application of dissolving bi-layer photoresist for rework processes.

The present invention overcomes the shortcomings of the prior art as will be set forth below with several preferred embodiments.

BRIEF SUMMARY OF THE INVENTION

The present invention is a composition for removal of multi-layer photoresist layers on an electronic device substrate for rework of the photoresist on the substrate, comprising; (i) a solvent blend of at least three discrete solvents, (ii) at least one organic sulfonic acid, and (iii) at least one corrosion inhibitor. The present invention is also a method for using the composition. This composition and method succeed in removing such multi-layer photoresist at temperatures less than 65° C. and in contact times under three minutes, allowing high throughput on single wafer tools.

DETAILED DESCRIPTION OF THE INVENTION

Figure 1:
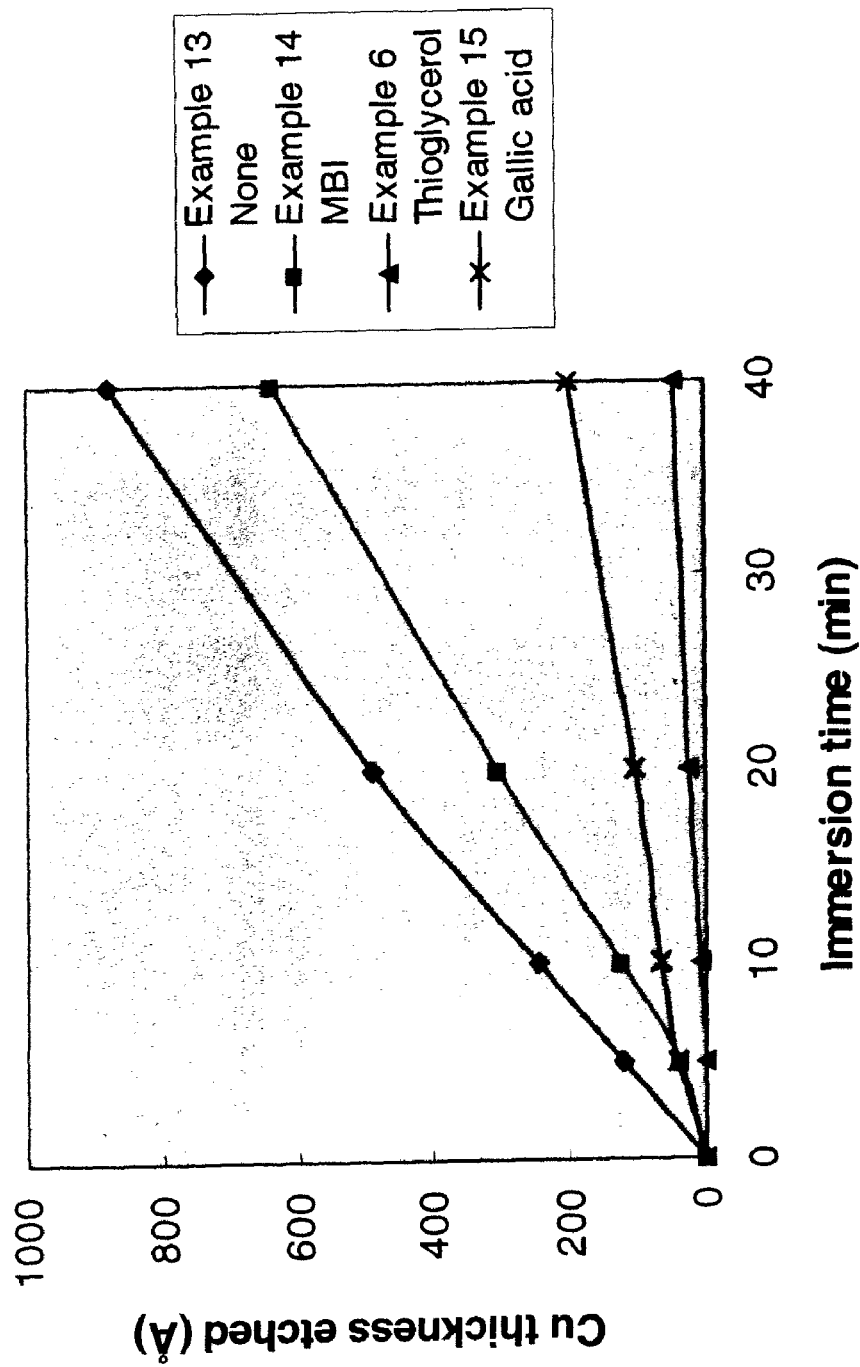
FIG. 1 is a graph of a comparative example without corrosion inhibitor and several examples exemplary of the present invention with a set solvent combination.

This invention discloses stripper compositions, particularly effective for removing multi-layer photoresist for rework, which comprise (a) a solvent blend of three discrete solvents (b) a suitable organosulfonic acid, and (c) a corrosion inhibitor.

Multi-layer photoresist has been used to overcome the disadvantages of a single layer photoresist having to perform multiple functions in a single layer. These multiple functions include: minimizing line width variations in the lithographically transferred circuit pattern; planar topographical coverage over device features that present varied topography; ready removal of the selected portion of the photoresist depending on whether it is a negative or positive photoresist; etch resistance after the photoresist has been developed and reflection suppression.

Successfully achieving all of those properties in a single layer photoresist is difficult and can result in undesired compromising of performance in one function to obtain acceptable performance in another function.

The semiconductor fabrication industry producing integrated circuits has recognized this and for some lithography utilities, has gone to multi-layer photoresist for a single level of features in the integrated circuit so that each photoresist layer of the multi-layer photoresist can be optimized to perform a selected function or functions.

The semiconductor fabrication industry has generally used a bi-layer photoresist to avoid the processing time, alignment and complexity of additional photoresist layers. None-the-less, even in the use of bi-layer photoresist, the deposition of the bi-layers can be sufficiently flawed, typically with regard to alignment issues so that it is desireable to remove the bi-layers of photoresist ("rework") and redeposit them, while saving the underlying substrate, which is of value due to other levels of circuitry already having been fabricated on the substrate.

Thus, a multi-layer photoresist stripping composition needs to meet several demanding criteria that have not been successfully achieved until the present invention, including: preserving device features on the underlying substrate, dissolution capability for more than one photoresist polymer material of construction in a single stripper solution, fast removal of the multiple layers and low temperature effective operation so that the wet cleaning process can proceed using various single wafer tools.

The stripper composition solutions of the present invention uniquely achieve those goals. The strippers are capable of removing photoresist by dissolution and are suitable for single wafer tool applications for performing rework. The components are mixed at room temperature.

The solvents are glycol ether and/or polyhydric alcohol blend. The glycol ethers are preferably glycol mono- or di-ethers. Exemplary glycol ethers included, ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl either, diethylene glycol monohexyl ether, diethylene glycol monobenzyl ether, diethylene glycol dimethyl ether, diethylene glycol methyl ethyl ether, diethylene glycol diethyl ether, diethylene glycol dibutyl ether, triethylene glycol monomethyl ether, triethylene glycol dimethyl ether, propylene glycol monomethyl ether, propylene glycol monoethyl ether, propylene glycol dimethyl ether, propylene glycol monobutyl ether, propylene glycol monopropyl ether, dipropylene glycol monomethyl ether, dipropylene glycol monoethyl ether, dipropylene glycol monopropyl ether, dipropylene glycol monoisopropyl ether, dipropylene glycol monobutyl ether, Dipropylene glycol mono tert-butyl ether, diproplylene glycol diisopropyl ether, dipropylene glycol dimethyl ether, tripropylene glycol monomethyl ether, 1-methoxy-2-butanol, 2-methoxy-1-butanol, 2-methoxy-2-methylbutanol, 1,1-dimethoxyethane and 2-(2-butoxyethoxy) ethanol.

Polyhydric alcohol are preferably mono-, di- or tri-alcohols, such as ($C_4$-$C_{20}$) alkanols, ($C_2$-$C_{20}$) alkanediols and ($C_3$-$C_{20}$) alkanetriols, cyclic alcohols and substituted alcohols. Exemplary alcohols include; glycerol, ethylene glycol, propylene glycol, diethylene glycol, dipropylene glycol, hexylene glycol, 1,2-butanediol, 1,4-butanediol, 2,3-butanediol, benzyl alcohol, tetrahydrofurfuryl alcohol, 1-octanol, diacetone alcohol and 1,4-cyclohexanedimethanol.

Organic solvent may be present. Examples of organic solvents include, but are not limited to, dimethylacetamide (DMAC), N-methyl pyrrolidinone (NMP), dimethylsulfoxide (DMSO), dimethylformamide, N-methylformamide, formamide, dimethyl-2-piperidone (DMPD), and other amides, alcohols or sulfoxides, or multifunctional compounds, such as hydroxyamides or amino alcohols Most preferably, the solvents are di(propylene glycol) monomethyl ether, benzyl alcohol, tetrahydrofurfuryl alcohol, 1-octanol, and propylene glycol.

It is important to have a solvent blend so that the blend's overall solubility parameters, which is determined by three dimensional Hildenbrand solubility parameters of hydrogen bonding, polarity and dispersion interactions, matches the parameters of the multilayer photoresist to be removed. Having three discrete solvents in the blend allows adequate variability to meet the overall solubility parameters necessary to remove a hard baked photoresist in the demanding limitations of the single wafer tool processing where a tool or cleaning equipment processes a single wafer at a time to remove its photoresist. When processing a single wafer, high throughput is required so minimum contact time is desired. Preferably, less than 3 minutes of contact time of the wafer to the stripper composition. The industry also wants that contact to be performed at relatively low temperatures no greater than 65° C.

The sulfonic acid is preferably an alkylsulfonic acid represented by $R^1SO_3H$ ($R^1$ denotes an alkyl group having 1-4 carbon) or an alkylbenzenesulfonic acid represented by $R^2$-A-$SO_3H$ ($R^2$ denotes an alkyl group having 1 to 16 carbons, and A denotes a phenylene or naphthalene group), and the specific example thereof include methanesulfonic acid, ethanesulfonic acid, propanesulfonic acid, butanesulfonic acid, p-toluenesulfonic acid, 4-ethylbenzenesulfonic acid, dodecylbenzenesulfonic acid, cumenesulfonic acid, methylethylbenzenesulfonic acid, isomers of xylenesulfonic acid, benzenesulfonic acid, phenolsulfonic acid, 1,5-naphthalenedisulfonic acid, 2-naphthalenesulfonic acid, 1-naphthalenesulfonic acid. The sulfonic acid is more preferably an alkylbenzenesulfonic acid, and yet more preferably p-toluenesulfonic acid.

The corrosion inhibitor is at least one of mercapto compound, which includes 1-mercaptopropanediol (thioglycerol), mercaptoethanol, 3-mercapto-2-butanol, 1-mercapto-2-propanol, 3-mercaptopropionic acid, mercaptosuccinic acid, 2-mercaptophenol, 2-mercaptobenzoic acid, 2-mercaptobezoxazole, 2-mercaptobenzothiazole, 2-mercaptobenzoimidazole ("MBI"), 2-mercaptoimidazole, 2-mercapto-5-methylbenzimidazole, 2-mercaptonicotinic acid, 3-mercaptopropyltrimethoxysilane and 1-[(2-hydroxyethyl)thio]-3-(octyloxy)-2-propanol (HyTOP). Any corrosion inhibitor known in the art for similar applications, such as those disclosed in U.S. Pat. No. 5,417,877 which are incorporated herein in their entirety by reference, may be used. Corrosion inhibitors may be, for example, an organic acid, an organic acid salt, a phenol, a triazole. Examples of particular corrosion inhibitors include citric acid, anthranilic acid, gallic acid, benzoic acid, isophthalic acid, maleic acid, fumaric acid, D,L-malic acid, malonic acid, phthalic acid, maleic anhydride, phthalic anhydride, benzotriazole (BZT), tolytriazole, 1,2,4-triazole, resorcinol, carboxybenzotriazole, diethyl hydroxylamine and the lactic acid and citric acid salts thereof, and the like. Further examples of corrosion inhibitors that may be used include catechol, pyrogallol, and esters of gallic acid. Yet other examples of suitable corrosion inhibitors include fructose, ammonium thiosulfate, glycine, lactic acid, tetramethylguanidine, iminodiacetic acid, and dimethylacetoacetamide. The corrosion inhibitor is more preferably 1-mercaptopropanediol (thioglycerol).

The composition and method of the present invention avoids inorganic fluoride containing compounds because fluoride containing compounds, particularly in acidic media, can be destructive to low k insulating dielectric films.

Because the present invention is removing polymer photoresist and not inorganic materials (ashing and etching residues), it is preferred not to have any significant aqueous phase, which would otherwise alter the overall solubility parameter of the solvent blend which would adversely effect the solubility of the polymer of the photoresist. As used in the present invention, non-aqueous is intended to exclude any intentionally added water or any significant aqueous phase that would change the solubility properties of the solvent blend in relation to the photoresist polymer to the extent the photoresist polymer could not be essentially completely removed on a single wafer tool at 65° C. and three minutes or less of contact time. Incidental and minor amounts of water can be tolerated, such as the water introduced from the sulfonic acid addition (p-Toluenesulfonic acid monohydrate), or minor content in solvents that are not thoroughly dried. Less water (<5%) is preferred and essentially no water (<1%) is more preferred.

Examples of compositions that were used to generate the data in Tables 1 and 2 are:

Example 1

| Compound | wt % |
| --- | --- |
| Di(proplyene glycol) methyl ether | 51.7 |
| p-Toluenesulfonic acid | 10 |
| Tetrahydrofurfuryl alcohol | 10.3 |
| Benzyl alcohol | 26 |
| Thioglycerol | 2 |

Example 2

| Compound | wt % |
| --- | --- |
| Di(proplyene glycol) methyl ether | 45.9 |
| p-Toluenesulfonic acid | 20 |
| Tetrahydrofurfuryl alcohol | 9.1 |
| Benzyl alcohol | 23 |
| Thioglycerol | 2 |

Example 3

| Compound | wt % |
| --- | --- |
| Di(proplyene glycol) methyl ether | 45.9 |
| p-Toluenesulfonic acid | 20 |
| 1-Octanol | 9.1 |
| Benzyl alcohol | 23 |
| Thioglycerol | 2 |

Example 4

| Compound | wt % |
| --- | --- |
| Di(proplyene glycol) methyl ether | 48.8 |
| p-Toluenesulfonic acid | 15 |
| Tetrahydrofurfuryl alcohol | 24.5 |
| PG | 9.7 |
| Thioglycerol | 2 |

Example 5

| Compound | wt % |
| --- | --- |
| Di(proplyene glycol) methyl ether | 51.7 |
| p-Toluenesulfonic acid | 10 |
| PG | 10.3 |
| Benzyl alcohol | 26 |
| Thioglycerol | 2 |

Example 6

| Compound | wt % |
| --- | --- |
| Di(proplyene glycol) methyl ether | 51.7 |
| p-Toluenesulfonic acid | 10 |
| Tetrahydrofurfuryl alcohol | 26 |
| PG | 10.3 |
| Thioglycerol | 2 |

Example 7

Comparative Example 1

| Compound | wt % |
| --- | --- |
| Di(proplyene glycol) methyl ether | 88 |
| p-Toluenesulfonic acid | 10 |
| Thioglycerol | 2 |

The cleaning compositions are useful for removal of bi-layer photoresist layers (bi-layer photoresist rework) prior to etch/ash processes in Cu/low-k integration. The cleaning compositions are designed to be able to use for single wafer tool process.

The formulations of the present invention were evaluated in a beaker test where a test coupon having copper metal and/or various silicon oxide dielectric layers were immersed in the formulations to determine the etch rate of the formulations for features on the substrates being cleaned of photoresist that it is not desireable to damage, etch or remove. The summary of etch rates on blanket copper and low k dielectrics, such as fluorinated silicon oxide derived from tetraethyl orthosilicate (FTEOS) and Black Diamond™ I film (BDI, available from Applied Materials Inc., Santa Clara, Calif.) are provided in Table 1. In all of the following etch rates, measurements were conducted at 5, 10, 20, 40, and 60 minutes of exposure at temperature of 60° C., Thickness measurements were determined at each time interval and graphed using a "least squares fit" model on the results for each exemplary composition. The calculated slope of the "least squares fit" model of each composition is the resultant etch rate provided in angstroms/minute (Å/min). In determining either the copper etch rate or dielectrics etch rate, the wafers had a blanker layer of a known thickness deposited on Si wafer. For Cu etch rate, the initial thickness of the wafer was determined using the CDE ResMap 273 Four Point Probe. After determining the initial thickness, test wafers were immersed in the exemplary compositions. After five minutes, the test wafers were removed from the test solution, rinsed for three minutes with deionized water and completely dried under nitrogen. The thickness of each wafer was measured and if necessary the procedure was repeated on the test wafer. For FTEOS and BDI etch rate, the initial thickness was determined using a FilmTek 2000 SE Spectroscopic Ellipsometer/Reflectomer. Approximately 200 mls of a test solution were placed in a 250 ml beaker with stirring and heated, if required, to the specified temperature. If only one wafer was placed in a beaker containing solution, a dummy wafer was also placed in the beaker. After five minutes, each test wafer was removed, washed with deionized water for three minutes and dried under nitrogen. The substrates were then baked at a temperature of 110° C. for approximately 10 minutes. Measurements of each wafer were taken and if necessary the procedure was repeated.

Table 1 shows that the various formulations of the present invention do not appreciably etch or damage copper, the primary metal for conductive lines used in integrated circuits; FTEOS, a typical dielectric used as an insulating layer between device stacks or copper conducting lines in integrated circuits; and BDI, another silicon oxide dielectric used as an insulating layer between device stacks or copper conducting lines in integrated circuits. Table 1 shows a strong selectivity of the formulations of the present invention for not attacking desired materials of construction in an integrated circuit device layer stack, while removing photoresist.

TABLE 1

Compatibility: Cu, FTEOS and BDI etch rate data

| Formulations | Temperature °C. | Etch rate (Å/minutes) | | |
| --- | --- | --- | --- | --- |
| | | Cu | FTEOS | BDI |
| Example 1 | 60 | 1 | <1 | <1 |
| Example 2 | 60 | 2 | <1 | <1 |
| Example 3 | 60 | 1 | nt | nt |
| Example 4 | 60 | 1 | nt | nt |
| Example 5 | 60 | 1 | nt | nt |
| Example 6 | 60 | 1 | <1 | <1 |

FTEOS is a fluorinated silicon dioxide dielectric deposited from tetraethylorthosilicate.
BDI is a silicon oxide dielectric deposited from precursors and methods of Applied Materials, Inc., Santa Clara, CA.
nt means not tested.

Table 2 shows the effectiveness of the formulations of the present invention in removing photoresist from a electronic device substrate or semiconductor substrate as a function of various temperatures, all below 65° C. and with contact times less than 3 minutes, showing its surprising effectiveness in removing photoresist completely at low temperatures and short contact times, previously not commercially practiced by the photoresist stripping industry and the integrated circuit fabrication industry. The wafers had bi-layer photoresist layers and the underlying substrate comprising FTEOS layer, BDI layer, silicon oxide layer, a titanium nitride barrier layer, and a copper metallization layer. The top photoresist layer was exposed to light and developed, and the underlayer photoresist was hard baked. The substrates were then processed by immersing the substrate in preferred compositions. In this procedure, one or more test wafers were placed in a 600 milliliter (ml) beaker that contained 400 mls of each composition. The 600 ml beaker further included a 1 inch stir bar that rotated at 400 revolutions per minute. The compositions, having the wafer(s) contained therein, were then heated at the time and temperature set forth in Table 2. After exposure to the preferred compositions, the wafer(s) were rinsed with deionized water and dried with nitrogen gas. The wafers were cleaved to expose an edge and then examined using scanning electron microscopy (SEM) on a variety of pre-determined locations on the wafer. The results of the cleaning performance were visually interpreted as set forth in Table 2. Example 7 is a comparative example, which does not use a solvent blend as do Examples 1-6. Example 7 would not be amenable to use in a single wafer photoresist stripping tool at the desired temperatures.

TABLE 2

Cleaning performance

| Formulations | Time minutes | Cleaning performance at Temperature (° C.) | | | |
|---|---|---|---|---|---|
| | | 45 | 50 | 55 | 60 |
| Example 1 | 2 | − | + | +++ | +++ |
| Example 2 | 2 | − | + | +++ | +++ |
| Example 3 | 2 | nt | nt | + | +++ |
| Example 4 | 2 | nt | nt | ++ | +++ |
| Example 5 | 2 | nt | nt | ++ | +++ |
| Example 6 | 2 | nt | + | ++ | +++ |
| Example 7 | 2 | nt | − | − | + |

"+++" completely dissolved
"++" almost completely dissolved
"+" partially dissolved
"−" not dissolved
"nt" not tested Additional runs were performed to compare embodiments of the present invention to runs that do not include all of the features of the present invention to show the significance of the inclusion of those features. These additional runs also show that various species of solvents, sulfonic acids and corrosion inhibitors can be substituted without departing from the present invention and its performance.

Cu Corrosions Compositions

Example 8

Comparative Example 2

| Compound | wt % |
|---|---|
| Di(propylene glycol) methyl ether | 52.9 |
| p-Toluenesulfonic acid | 10 |
| Tetrahydrofurfuryl alcohol | 10.5 |
| Benzyl alcohol | 26.6 |

Example 9

| Compound | wt % |
|---|---|
| Di(propylene glycol) methyl ether | 51.7 |
| p-Toluenesulfonic acid | 10 |
| Tetrahydrofurfuryl alcohol | 10.3 |
| Benzyl alcohol | 26 |
| Benzotriazole | 2 |

Example 10

| Compound | wt % |
|---|---|
| Di(propylene glycol) methyl ether | 51.7 |
| p-Toluenesulfonic acid | 10 |
| Tetrahydrofurfuryl alcohol | 10.3 |
| Benzyl alcohol | 26 |
| Tolyltriazole | 2 |

Example 11

| Compound | wt % |
|---|---|
| Di(propylene glycol) methyl ether | 52.85 |
| p-Toluenesulfonic acid | 10 |
| Tetrahydrofurfuryl alcohol | 10.3 |
| Benzyl alcohol | 26 |
| 1-[(2-hydroxyethyl)thio]-3-(octyloxy)-2-propanol | 0.85 |

Example 12

| Compound | wt % |
|---|---|
| Di(propylene glycol) methyl ether | 51.7 |
| p-Toluenesulfonic acid | 10 |
| Tetrahydrofurfuryl alcohol | 10.3 |
| Benzyl alcohol | 26 |
| Gallic acid | 2 |

Example 13

Comparative Example 3

| Compound | wt % |
|---|---|
| Di(propylene glycol) methyl ether | 52.9 |
| p-Toluenesulfonic acid | 10 |
| Tetrahydrofurfuryl alcohol | 26.6 |
| Propylene glycol | 10.5 |

Example 14

| Compound | wt % |
|---|---|
| Di(propylene glycol) methyl ether | 51.7 |
| p-Toluenesulfonic acid | 10 |
| Tetrahydrofurfuryl alcohol | 26 |
| Propylene glycol | 10.3 |
| 2-Mercaptobenzoimidazole | 2 |

Example 15

| Compound | wt % |
|---|---|
| Di(propylene glycol) methyl ether | 51.7 |
| p-Toluenesulfonic acid | 10 |
| Tetrahydrofurfuryl alcohol | 26 |
| Propylene glycol | 10.3 |
| Gallic acid | 2 |

Sulfonic Acid Compositions

Example 16

| Compound | wt % |
|---|---|
| Di(propylene glycol) methyl ether | 51.7 |
| Methanesulfonic acid | 10 |
| Tetrahydrofurfuryl alcohol | 26 |
| Propylene glycol | 10.3 |
| Thioglycerol | 2 |

Example 17

| Compound | wt % |
|---|---|
| Di(propylene glycol) methyl ether | 51.7 |
| 1,5-naphthalenedisulfonic acid | 10 |
| Tetrahydrofurfuryl alcohol | 26 |
| Propylene glycol | 10.3 |
| Thioglycerol | 2 |

Example 18

| Compound | wt % |
|---|---|
| Di(propylene glycol) methyl ether | 51.7 |
| 2-naphthalenesulfonic acid | 10 |
| Tetrahydrofurfuryl alcohol | 26 |
| Propylene glycol | 10.3 |
| Thioglycerol | 2 |

Example 19

| Compound | wt % |
|---|---|
| Di(propylene glycol) methyl ether | 51.7 |
| 1-naphthalenesulfonic acid | 10 |
| Tetrahydrofurfuryl alcohol | 26 |
| Propylene glycol | 10.3 |
| Thioglycerol | 2 |

Glycol Ether Solvent Compositions

Example 20

| Compound | wt % |
|---|---|
| Diethylene glycol monobutyl ether | 51.7 |
| p-Toluenesulfonic acid | 10 |
| Tetrahydrofurfuryl alcohol | 26 |
| Propylene glycol | 10.3 |
| Thioglycerol | 2 |

Example 21

| Compound | wt % |
|---|---|
| Tripropylene glycol monomethyl ether | 51.7 |
| p-Toluenesulfonic acid | 10 |
| Tetrahydrofurfuryl alcohol | 26 |
| Propylene glycol | 10.3 |
| Thioglycerol | 2 |

Example 22

| Compound | wt % |
|---|---|
| Dipropylene glycol monobutyl ether | 51.7 |
| p-Toluenesulfonic acid | 10 |
| Tetrahydrofurfuryl alcohol | 26 |
| Propylene glycol | 10.3 |
| Thioglycerol | 2 |

Example 23

| Compound | wt % |
|---|---|
| Dipropylene glycol monobutyl ether | 31.5 |
| p-Toluenesulfonic acid | 10 |
| Tetrahydrofurfuryl alcohol | 38.5 |
| Propylene glycol | 18 |
| Thioglycerol | 2 |

Example 24

| Compound | wt % |
| --- | --- |
| Tripropylene glycol monobutyl ether | 51.7 |
| p-Toluenesulfonic acid | 10 |
| Tetrahydrofurfuryl alcohol | 26 |
| Propylene glycol | 10.3 |
| Thioglycerol | 2 |

Example 25

| Compound | wt % |
| --- | --- |
| Tripropylene glycol monobutyl ether | 39.5 |
| p-Toluenesulfonic acid | 10 |
| Tetrahydrofurfuryl alcohol | 33.5 |
| Propylene glycol | 15 |
| Thioglycerol | 2 |

Example 26

| Compound | wt % |
| --- | --- |
| Diethylene glycol monobutyl ether | 51.7 |
| p-Toluenesulfonic acid | 10 |
| Tetrahydrofurfuryl alcohol | 10.3 |
| Benzyl alcohol | 26 |
| Thioglycerol | 2 |

Example 27

| Compound | wt % |
| --- | --- |
| Tripropylene glycol monomethyl ether | 51.7 |
| p-Toluenesulfonic acid | 10 |
| Tetrahydrofurfuryl alcohol | 10.3 |
| Benzyl alcohol | 26 |
| Thioglycerol | 2 |

Composition Ranges

| Solvent blend | 40-98.9% |
| --- | --- |
| Sulfonic Acid | 1-30% |
| Corrosion inhibitor | 0.1-10% |

Preferred Ranges

| Solvent blend | 75-94.5% |
| --- | --- |
| Sulfonic Acid | 5-20% |
| Corrosion inhibitor | 0.5-5% |

TABLE 3

| | | | Cleaning performance | |
| --- | --- | --- | --- | --- |
| | Corrosion | Time | temperature | |
| Formulations | inhibitors | minutes | 55° C. | 60° C. |
| Example 11 | HyTOP | 2 | ++ | +++ |
| Example 12 | Gallic acid | 2 | + | ++ |
| Example 15 | Gallic acid | 2 | + | +++ |

"+++" completely dissolved
"++" almost dissoved
"+" partially dissolved
"−" not dissolved Table 3 compares a representative number of the examples for cleaning performance. Table 3 demonstrates that the present invention can use various corrosion inhibitors and still achieve the resist solvation and removal desired for rework of multi-layer resist under the parameters required for single wafer tools.

TABLE 4

Sulfonic Acid Performance

| | | | Cleaning performance | |
| --- | --- | --- | --- | --- |
| | | Time | temperature | |
| Formulations | sulfonic acids | minutes | 55° C. | 60° C. |
| Example 16 | Methanesulfonic acid | 2 | +++ | +++ |
| Example 17 | 1,5-naphthalenedisulfonic acid | 2 | − | ++ |
| Example 18 | 2-naphthalenesulfonic acid | 2 | ++ | +++ |
| Example 19 | 1-naphthalenesulfonic acid | 2 | ++ | +++ |

"+++" completely dissolved
"++" almost dissoved
"+" partially dissolved
"−" not dissolved Table 4 compares a representative number of the examples for cleaning performance. Table 4 demonstrates that the present invention can use a wide array of sulfonic acids and still achieve the resist solvation and removal desired for rework of multi-layer resist under the parameters required for single wafer tools.

Although not wanting to be bound to any particular theory of chemical activity, the present inventors believe that the sulfonic acids, being strong acids, can attack functional groups in the photoresist polymer and interrupt intermolecular bonding so as to break down the photoresist polymeric structure.

TABLE 5

Glycol Ether Solvent Performance

| | | | Cleaning performance | |
| --- | --- | --- | --- | --- |
| | | Time | temperature | |
| Formulations | glycol ethers | minutes | 55° C. | 60° C. |
| Example 20 | Diethylene glycol monobutyl ether | 2 | ++ | +++ |
| Example 21 | Tripropylene glycol monomethyl ether | 2 | ++ | +++ |
| Example 23 | Dipropylene glycol monobutyl ether | 2 | + | +++ |
| Example 25 | Tripropylene glycol monobutyl ether | 2 | ++ | +++ |
| Example 26 | Diethylene glycol monobutyl ether | 2 | +++ | +++ |

TABLE 5-continued

Glycol Ether Solvent Performance

| | | Cleaning performance | | |
|---|---|---|---|---|
| | | Time | temperature | |
| Formulations | glycol ethers | minutes | 55° C. | 60° C. |
| Example 27 | Tripropylene glycol monomethyl ether | 2 | ++ | ++ |

"+++" completely dissolved
"++" almost dissoved
"+" partially dissolved
"−" not dissolved Table 5 compares a representative number of the examples varying solvent for cleaning performance. Table 5 demonstrates that the present invention can use a wide array of glycol ethers and still achieve the resist solvation and removal desired for rework of multi-layer resist under the parameters required for single wafer tools.

Although not wanting to be bound to any particular theory of chemical activity, the present inventors believe that the glycol ethers have strong solvation action on polymeric resist. In addition, when used in solvent blends of other solvents or alcohols, the solvents can dissolve various polymers and polymer blends and copolymers.

Figure 2:
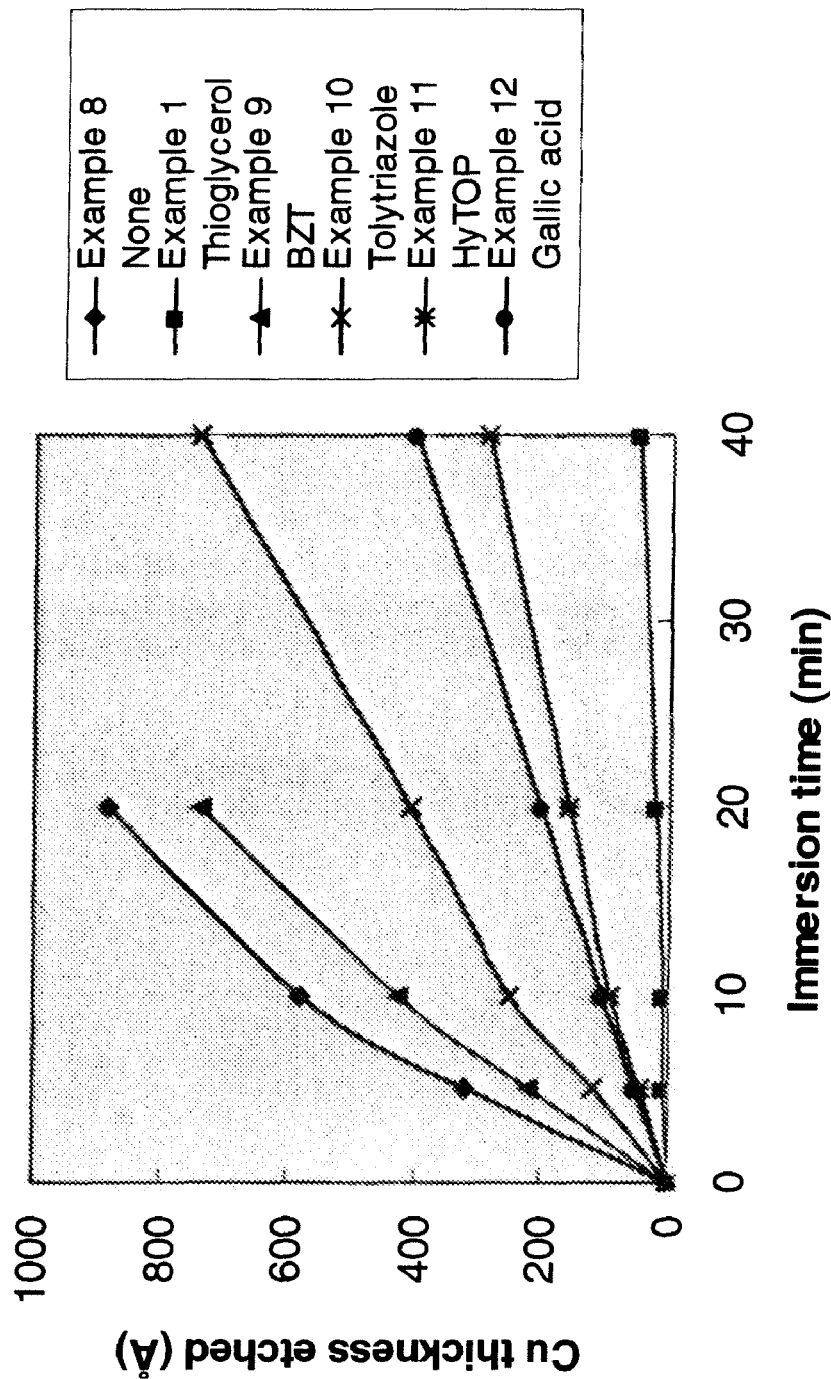
FIG. 2 is a graph of another comparative example without corrosion inhibitor and several examples exemplary of the present invention with a different set solvent combination than that of FIG. 1.

FIG. 1 and FIG. 2 each show the benefit of inclusion of various copper corrosion inhibitors in the photoresist stripper formulations so as to protect copper conductive lines while stripping away the undesired photoresist polymers. FIG. 1 compares Example 13 not having a corrosion inhibitor against various corrosion inhibitors of Examples 6, 14 and 15 using a set solvent combination. FIG. 2 shows a similar comparison of copper corrosion inhibition of Example 8 having no corrosion inhibitor in comparison to Examples 1, 9, 10, 11 and 12 having various corrosion inhibitors, but using a different solvent combination than the examples chosen in FIG. 1.

The invention claimed is:

1. A nonaqueous, nonfluoride-containing composition capable of removal of multi-layer photoresist layers on an electronic device substrate for rework of the photoresist on the substrate at no greater than 65° C. and contact time no greater than 3 minutes, consisting essentially of; (i) at least one non-polymeric glycol ether solvent, (ii) at least one non-aromatic alcohol solvent, (iii) at least one solvent selected from the group consisting of an aromatic alcohol and a glycol (iv) at least one organic sulfonic acid, and (v) at least one corrosion inhibitor.

2. The composition of claim 1 wherein the (iii) solvent is selected from the group consisting of propylene glycol and benzyl alcohol.

3. The composition of claim 1 wherein the organic sulfonic acid is selected from the group consisting of:

$$R^1SO_3H$$

wherein $R^1$ denotes an alkyl group having 1-4 carbons;

$$R^2\text{-A-}SO_3H$$

wherein $R^2$ denotes an alkyl group having 1 to 16 carbons, and A denotes a phenylene or naphthalene group; and mixtures thereof.

4. The composition of claim 1 wherein the organic sulfonic acid is selected from the group consisting of methanesulfonic acid, ethanesulfonic acid, propanesulfonic acid, butanesulfonic acid, p-toluenesulfonic acid, 4-ethylbenzenesulfonic acid, dodecylbenzenesulfonic acid, cumenesulfonic acid, methylethylbenzenesulfonic acid, isomers of xylenesulfonic acid, benzenesulfonic acid, phenolsulfonic acid, naphthalenesulfonic acid and mixtures thereof.

5. The composition of claim 1 wherein the corrosion inhibitor is selected from the group consisting of thiogycerol, mercaptoethanol, mercaptobenzodiazole, gallic acid, 1-[(2-hydroxyethyl)thio]-3-(octyloxy)-2-propanol and mixtures thereof.

6. A composition for removal of multi-layer photoresist layers on an electronic device substrate for rework of the photoresist on the substrate, consisting essentially of; di(proplyene glycol) methyl ether, p-toluenesulfonic acid, tetrahydrofurfuryl alcohol, benzyl alcohol, 1-[(2-hydroxyethyl)thio]-3-(octyloxy)-2-propanol and gallic acid.

7. A composition capable of removal of multi-layer photoresist layers on an electronic device substrate for rework of the photoresist on the substrate at no greater than 65° C. and contact time no greater than 3 minutes, consisting essentially of; di(proplyene glycol) methyl ether, p-toluenesulfonic acid, tetrahydrofurfuryl alcohol, propylene glycol and thioglycerol.

8. A composition capable of removal of multi-layer photoresist layers on an electronic device substrate for rework of the photoresist on the substrate at no greater than 65° C. and contact time no greater than 3 minutes, consisting essentially of; di(proplyene glycol) methyl ether, p-toluenesulfonic acid, tetrahydrofurfuryl alcohol, propylene glycol and gallic acid.

9. A method for removal of multi-layer photoresist layers on an electronic device substrate for rework of the photoresist on the substrate, comprising contacting the multi-layer photoresist layers on the electronic device substrate at a temperature of no greater than 65° C. and contact time no greater than 3 minutes with a nonaqueous, nonfluoride-containing photoresist stripper composition, consisting essentially of (i) at least one non-polymeric glycol ether solvent, (ii) at least one non-aromatic alcohol solvent, (iii) at least one solvent selected from the group consisting of an aromatic alcohol and a glycol, (iv) at least one organic sulfonic acid, and (v) at least one corrosion inhibitor.

10. The method of claim 9 wherein the contacting is conducted on a single wafer tool.

11. The method of claim 9 wherein the (iii) solvent is selected from the group consisting of propylene glycol, and benzyl alcohol.

12. The method of claim 9 wherein the organic sulfonic acid is selected from the group consisting of:

$$R^1SO_3H$$

wherein $R^1$ denotes an alkyl group having 1-4 carbons;

$$R^2\text{-A-}SO_3H$$

wherein $R^2$ denotes an alkyl group having 1 to 16 carbons, and A denotes a phenylene or naphthalene group; and mixture thereof.

13. The method of claim 9 wherein the organic sulfonic acid is selected from the group consisting of methanesulfonic acid, ethanesulfonic acid, propanesulfonic acid, butanesulfonic acid, p-toluenesulfonic acid, 4-ethylbenzenesulfonic acid, dodecylbenzenesulfonic acid, cumenesulfonic acid, methylethylbenzenesulfonic acid, isomers of xylenesulfonic acid, benzenesulfonic acid, phenolsulfonic acid, naphthalenesulfonic acid and mixtures thereof.

14. The method of claim 9 wherein the corrosion inhibitor is selected from the group consisting of thioglycerol, mercaptoethanol, mercaptobenzodiazole, 1-[(2-hydroxyethyl)thio]-3-(octyloxy)-2-propanol, gallic acid and mixtures thereof.

* * * * *

UNITED STATES PATENT AND TRADEMARK OFFICE
CERTIFICATE OF CORRECTION

PATENT NO. : 8,288,330 B2  
APPLICATION NO. : 11/738699  
DATED : October 16, 2012  
INVENTOR(S) : Aiping Wu and John Anthony Marsella It is certified that error appears in the above-identified patent and that said Letters Patent is hereby corrected as shown below:

In the claims:

Column 14, line 12
   delete the word "di(proplyene)" and insert the word --di(propylene)--.

Column 14, line 18
   delete the word "di(proplyene)" and insert the word --di(propylene)--.

Column 14, line 25
   delete the word "di(proplyene)" and insert the word --di(propylene)--.

Signed and Sealed this  
Eighteenth Day of June, 2013

Teresa Stanek Rea  
*Acting Director of the United States Patent and Trademark Office*